United States Patent
Shen et al.

(10) Patent No.: US 11,189,518 B2
(45) Date of Patent: Nov. 30, 2021

(54) METHOD OF PROCESSING A SEMICONDUCTOR WAFER

(71) Applicant: Advanced Semiconductor Engineering, Inc., Kaohsiung (TW)

(72) Inventors: Yan Ting Shen, Kaohsiung (TW); Bo Hua Chen, Kaohsiung (TW); Fu Tang Chu, Kaohsiung (TW); Wen Han Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/685,900

(22) Filed: Nov. 15, 2019

(65) Prior Publication Data

US 2021/0151342 A1 May 20, 2021

(51) Int. Cl.
*H01L 21/68* (2006.01)
*H01L 21/683* (2006.01)
*H01L 21/02* (2006.01)
*H01L 21/768* (2006.01)

(52) U.S. Cl.
CPC .... *H01L 21/6836* (2013.01); *H01L 21/02013* (2013.01); *H01L 21/02016* (2013.01); *H01L 21/76894* (2013.01)

(58) Field of Classification Search
CPC ........... H01L 21/6836; H01L 21/02013; H01L 21/02016; H01L 21/76894
See application file for complete search history.

(56) References Cited

U.S. PATENT DOCUMENTS

| | | | | |
|---|---|---|---|---|
| 7,262,488 | B2 * | 8/2007 | Draney | H01L 21/02016 257/632 |
| 8,852,391 | B2 * | 10/2014 | McCutcheon | H01L 21/6835 156/714 |
| 9,076,701 | B2 * | 7/2015 | Han | H01L 23/49827 |
| 9,269,623 | B2 * | 2/2016 | Oliver | C09J 5/00 |
| 9,653,335 | B2 * | 5/2017 | Kato | C09J 183/04 |
| 10,784,164 | B2 * | 9/2020 | Priewasser | H01L 21/6835 |
| 2005/0221598 | A1 * | 10/2005 | Lu | H01L 24/13 438/613 |
| 2007/0298532 | A1 * | 12/2007 | Machauf | B81C 1/00333 438/48 |
| 2008/0194053 | A1 * | 8/2008 | Huang | B06B 1/0292 438/53 |
| 2012/0220063 | A1 * | 8/2012 | Seong | H01L 33/647 438/46 |

(Continued)

*Primary Examiner* — Mohammed Shamsuzzaman
(74) *Attorney, Agent, or Firm* — Foley & Lardner LLP (57) ABSTRACT

A method of processing a semiconductor wafer is provided. The method includes providing a semiconductor wafer having a front side and a back side, the semiconductor wafer provided with a circuit layer at the front side and a patterned surface at the back side, forming a sacrificial layer on the back side, mounting a tape on the sacrificial layer, the sacrificial layer isolating the patterned surface from the tape, wherein adhesion strength between the sacrificial layer and the patterned surface is larger than that between the sacrificial layer and the tape, dicing the semiconductor wafer at the back side through the tape, defining individual chips on the semiconductor wafer, and expanding the tape to separate the chips from each other.

14 Claims, 8 Drawing Sheets

(56) References Cited

U.S. PATENT DOCUMENTS

2014/0038392 A1* 2/2014 Yonehara .............. B81C 1/0038
                                                        438/463
2017/0121850 A1* 5/2017 Miyazaki .......... H01L 21/02236
2018/0190614 A1* 7/2018 Kumar ................... H01L 24/81
2019/0096864 A1* 3/2019 Huitema ................ H01L 24/82

* cited by examiner

METHOD OF PROCESSING A SEMICONDUCTOR WAFER

BACKGROUND

1. Field of the Disclosure

The present disclosure generally relates to a method of processing a semiconductor wafer and, in particular, to a method of dicing a semiconductor wafer having a patterned surface at the backside.

2. Description of the Related Art

A semiconductor wafer may include a plurality of dies that may be processed to form individual chips from a single semiconductor wafer. Wafer dicing is a process by which dies are separated from a semiconductor wafer into chips. Following the dicing process the individual chips are encapsulated into chip carriers, which are then suitable for use in building electronic devices such as smart phones, computers, and so forth. Various dicing techniques, including mechanical sawing and laser cutting, can be used for dicing a semiconductor wafer.

SUMMARY

Embodiments of the present disclosure provide a method of processing a semiconductor wafer. The method includes providing a semiconductor wafer having a front side and a back side, the semiconductor wafer provided with a circuit layer at the front side and a patterned surface at the back side, forming a sacrificial layer on the back side, mounting a tape on the sacrificial layer, the sacrificial layer isolating the patterned surface from the tape, wherein adhesion strength between the sacrificial layer and the patterned surface is larger than that between the sacrificial layer and the tape, dicing the semiconductor wafer at the back side through the tape, defining individual chips on the semiconductor wafer, and expanding the tape to separate the chips from each other.

Some embodiments of the present disclosure also provide a method of processing a semiconductor wafer. The method includes providing a semiconductor wafer having a front side and a back side, the semiconductor wafer provided with optical devices exposed from the back side, forming a sacrificial layer on the back side, mounting a tape on the sacrificial layer, wherein the sacrificial layer isolating the optical devices from the tape, dicing the semiconductor wafer at the back side through the tape, defining individual chips on the semiconductor wafer, and expanding the tape to separate the chips from each other.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In semiconductor fabrication processes, wafer dicing plays an important role in the quality of the final product. Some dicing techniques, such as blade dicing, cut a wafer from the front side and can cause problems such as debris, chipping, cracking, damage to devices and loss of precious semiconductor material. A laser technique called stealth dicing (SD) can overcome these problems by cutting the wafer from the backside. SD involves a lasing process followed by a tape expansion process. However, for a semiconductor wafer having a patterned feature at a surface of the back side, a tape mounted to the back side is liable to tape residue on the patterned surface, which may adversely affect the desired functionality of the patterned feature. The present disclosure provides a sacrificial layer to isolate the tape from the patterned surface, and thereby prevents the patterned surface from contamination by tape residue.

Figure 1:
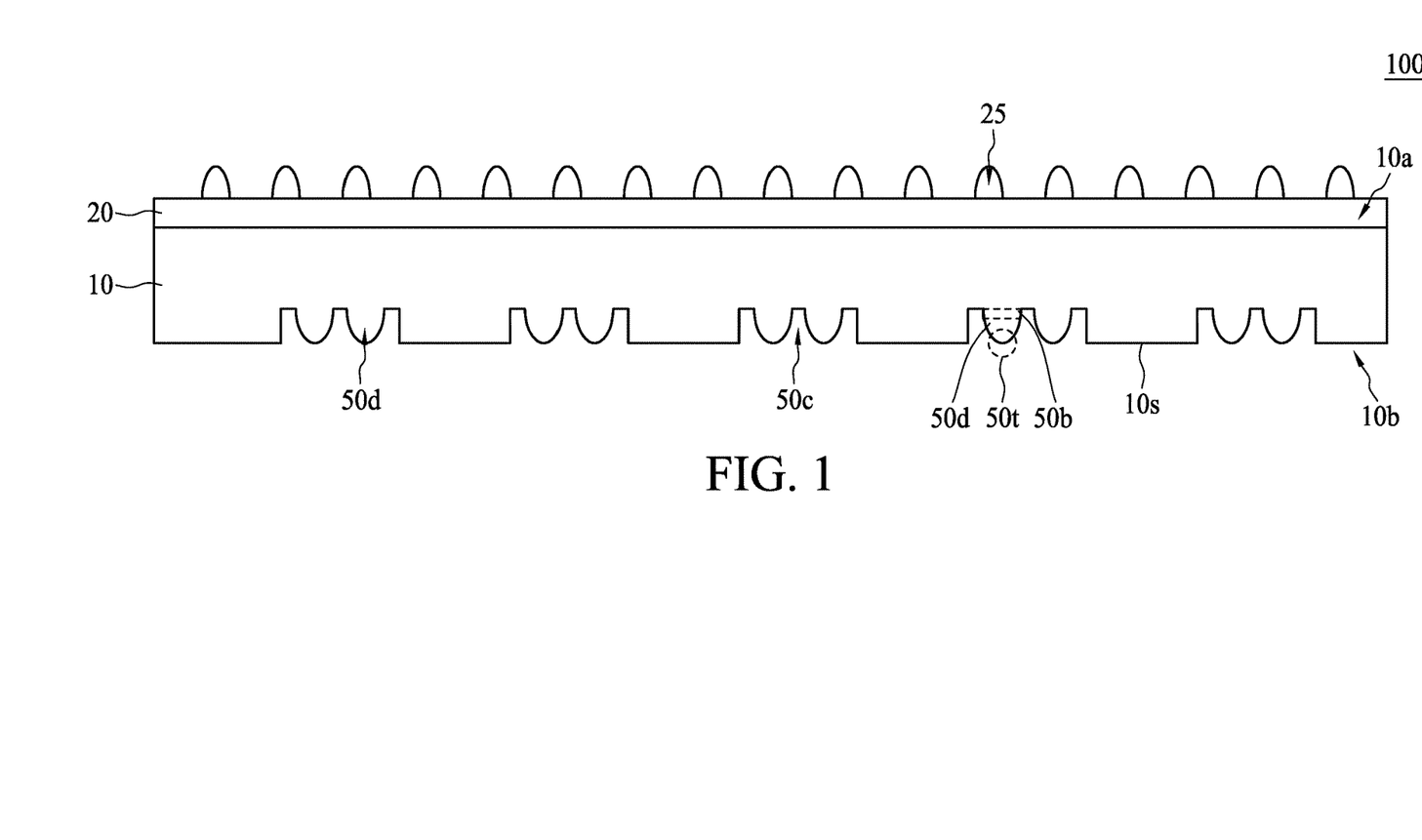
FIG. 1 is a cross-sectional view of a semiconductor wafer having a patterned surface at the backside, in accordance with an embodiment of the present disclosure.

FIG. 1 is a cross-sectional view of a semiconductor wafer 100 having a patterned surface at the backside, in accordance with an embodiment of the present disclosure.

Referring to FIG. 1, the semiconductor wafer 100 includes a substrate 10, for example, a silicon substrate. The substrate 10 has a front side 10a and a back side 10b opposite to the front side 10a. A circuit layer (not shown) is disposed in the substrate 10 at or near the front side 10a. The second side 10b is designed with a patterned feature at a surface 10s thereof (hereinafter the "patterned surface 10s"). In the present embodiment, the patterned feature includes a plurality of cavities 50c formed at the patterned surface 10s. In addition, optical devices 50d are arranged in the cavities 50 by using, for example, a pick-and-place process. In an embodiment, the cavities 50c may each have a depth ranging from approximately 60 micrometers (μm) to approximately 70 µm, and the optical devices 50*d* may each have a height ranging from approximately 45 µm to approximately 65 µm. The optical device 50*d* may function to detect light. Each of the optical devices 50*d* includes a bottom portion 50*b* and a top portion 50*t*. The bottom portion 50*b* seats the each optical device 50*d* in a corresponding cavity 50*c*, while the top portion 50*t* exposes the each optical device 50*d* from the corresponding cavity 50*c*. Accordingly, the semiconductor wafer 100 is provided with a patterned surface 10*s* at the back side 10*b*, and a plurality of optical devices 50*d* disposed in and exposed from the patterned surface 10*s*.

In the present embodiment, the semiconductor wafer 100 also includes a redistribution layer 20 on the front side 10*a* for fan-out purposes, and conductors 25 on the redistribution layer 20 for electrical connection. The conductors 25 may include conductive pillars, each of which may have a height ranging from approximately 55 µm to approximately 60 µm. In other embodiments, however, the redistribution layer 20 is optional and thus can be omitted. In that case, the conductors 25 may be arranged on the front side 10*a* of the semiconductor wafer 100.

Figure 2A:
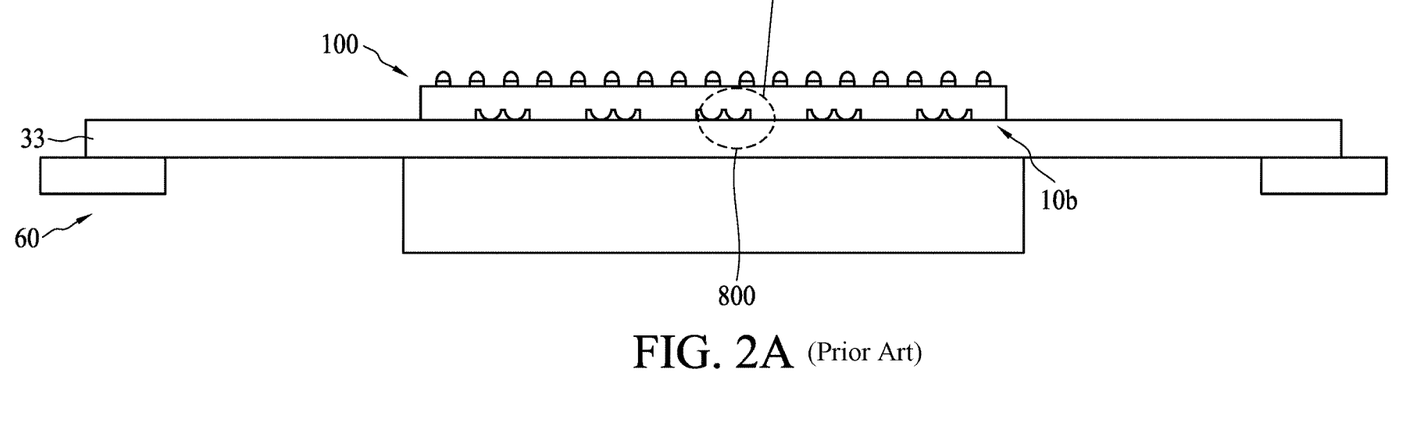
FIG. 2A, FIG. 2B, FIG. 2C, FIG. 2D, and FIG. 2E are schematic diagrams showing problems occurred during an expanding process in some existing approaches.
Figure 2B:
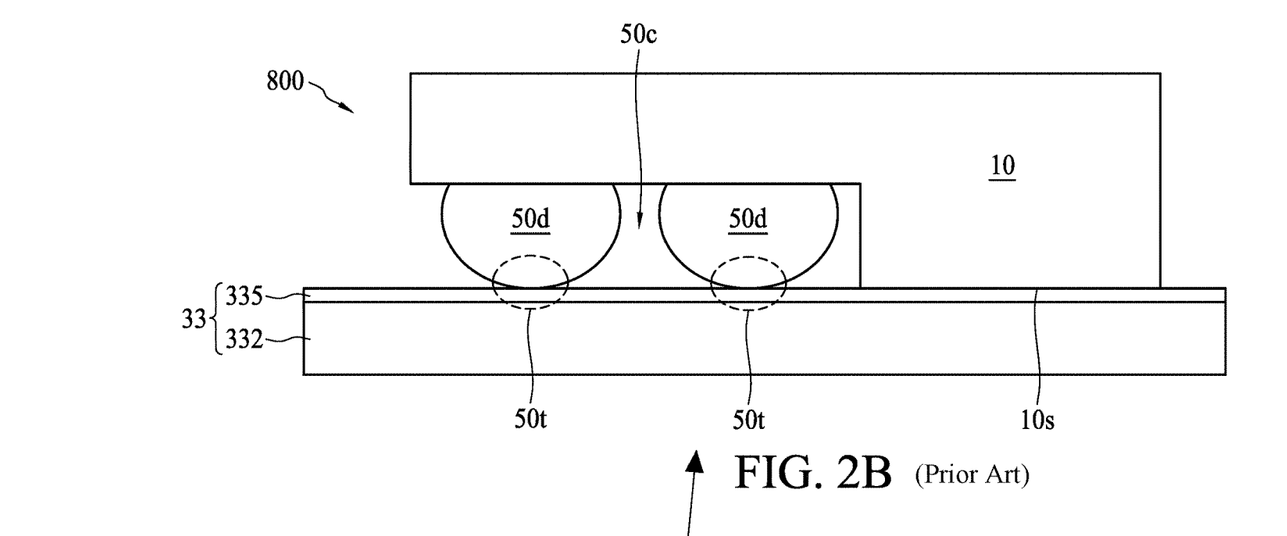
Figure 2C:
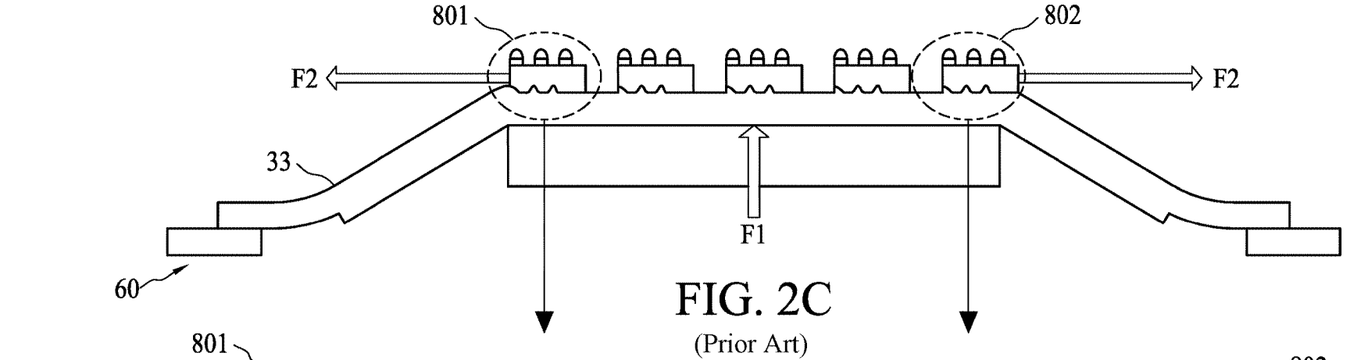
Figure 2D:
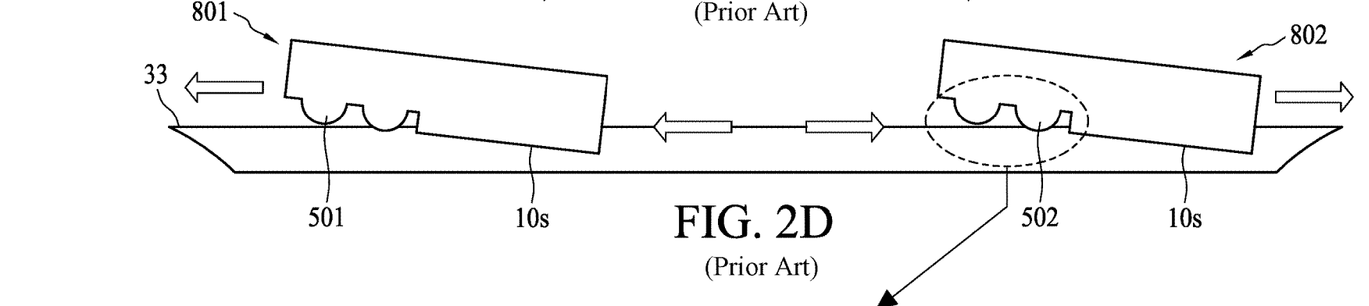
Figure 2E:
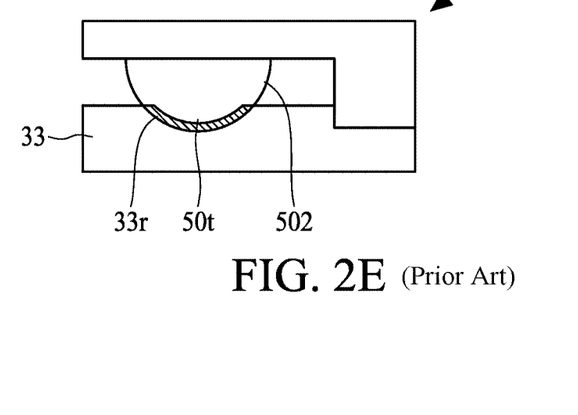

A laser dicing process such as stealth dicing may then be conducted on the semiconductor wafer 100 that has a patterned surface 10*s* at the back side 10*b*. Next, an expanding process with the help of a tape is conducted. As previously discussed, such semiconductor wafer would suffer the problem of tape residue since a tape mounted during an expanding process directly contacts the patterned surface. FIGS. 2A through 2E are schematic diagrams showing problems occurred during an expanding process in some existing approaches. Specifically, FIG. 2A illustrates an interface between a tape and the back side of a semiconductor wafer. FIG. 2B is an enlarged view showing an interface between the tape and an exemplary die in FIG. 2A. FIG. 2C illustrates an expanding operation. FIG. 2D is an enlarged view showing tilting of exemplary dies during the expanding operation in FIG. 2C. FIG. 2E is a further enlarged view showing tape residue on an exemplary die.

Referring to FIG. 2A, a tape 33 is mounted on the back side 10*b* of a semiconductor wafer 100. The tape 33 will be expanded by an expanding machine 60 to space apart dies 800 defined in the semiconductor wafer 100 in order for a subsequent die pick-up operation.

Referring to FIG. 2B, the tape 33 may include a two-ply construction that includes of a base film 332 and an adhesive layer 335 on the base film 332. As the tape 33 is mounted towards the back side 10*b*, the adhesive layer 335 of the tape 33 contacts a relatively planar portion of the patterned surface 10*s* and a rather constrained area at the top portion 50*t* of the optical device 50*d*. Adherence force of a substantially surface contact between the adhesive layer 335 and the planar patterned surface 10*s* is significantly larger than that of a substantially point contact between the adhesive layer 335 and the top portion 50*t*. The significantly different adherence force incurs a tilting issue with the dies 800, as will be discussed in detail below.

Referring to FIG. 2C, during the expanding process, the semiconductor wafer 100 together with the tape 33 is uplifted by a force F1 while the tape 33 is pulled radially outward by a force F2. Expansion of the tape 33 separates the dies 800, resulting in, for example, individual dies 801 and 802 that are each separated from an immediately adjacent die.

Referring to FIG. 2D, the dies 801 and 802, during moving along their respective directions of expansion, do not entirely stand firm on the tape 33 due to the difference in adherence force. Specifically, the optical devices 501 and 502 of the dies 801 and 802, respectively, are inclined to pitch up and therefor are detached from the adhesive layer 335 of the tape 33 due to the relatively weak point contact. On the contrary, the planar patterned surfaces 10*s* of the dies 801 and 802 are inclined to pitch down and therefor sink into the adhesive layer 335 of the tape 33 due to the relatively strong surface contact. Moreover, since the adhesive material of the adhesive layer 335 would adhere to the optical devices 501 and 502, in particular to the top portions 50*t* thereof, as the optical devices 501 and 502 pitch up, residue of the adhesive material remains on the optical devices 501 and 502, as illustrated in FIG. 2E.

FIGS. 3A through 3I are cross-sectional views illustrating one or more stages of a method of processing a semiconductor wafer as illustrated in FIG. 1, in accordance with an embodiment of the present disclosure.

Figure 3A:
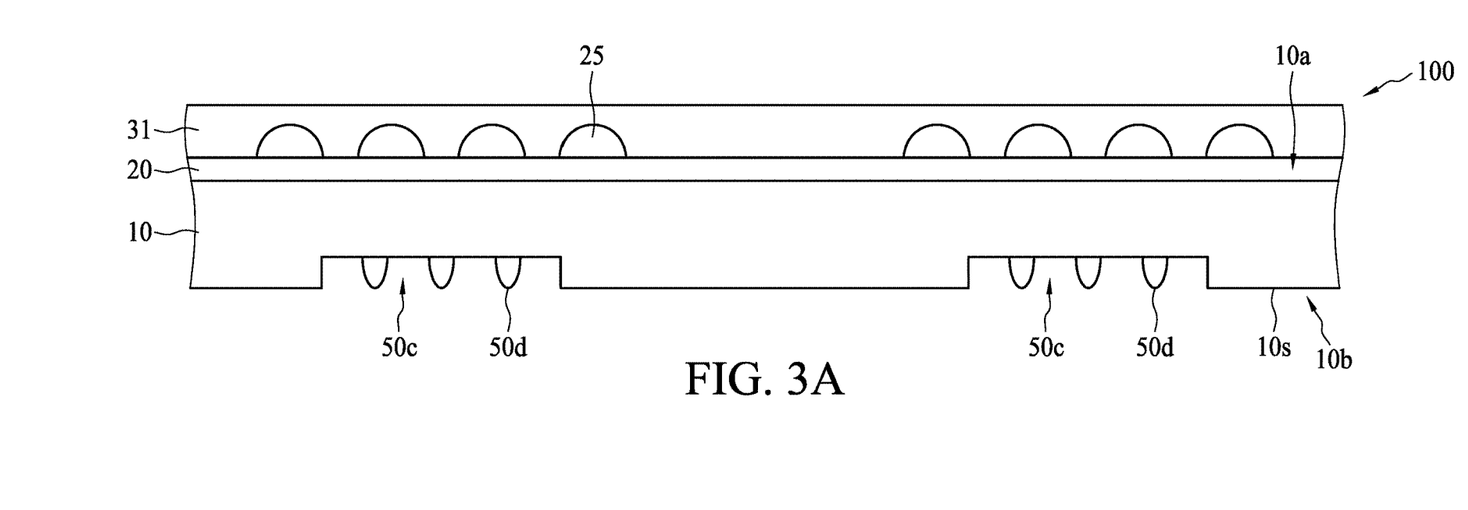
FIG. 3A, FIG. 3B, FIG. 3C, FIG. 3D, FIG. 3E, FIG. 3F, FIG. 3G, FIG. 3H, and FIG. 3I are cross-sectional views illustrating one or more stages of a method of processing a semiconductor wafer as illustrated in FIG. 1, in accordance with an embodiment of the present disclosure.

Referring to FIG. 3A, a semiconductor wafer 100 is provided. The semiconductor wafer 100 has a patterned surface 10*s* at the backside 10*b*. The patterned surface 10*s* includes cavities 50*c*, in which optical devices 50*d* are disposed. A first tape 31 for surface protection is attached at the first side 10*a* of the semiconductor wafer 100. The first tape 31 protects a circuit layer, in addition to the redistribution layer 20 and conductors 25, at the front side 10*a* from damage by foreign matter, chipping, cracking and contamination during a dicing process. In an embodiment, the first tape 31 includes a backgrind tape. Materials of the first tape 31 may be selected from those that can be easily de-taped from the semiconductor wafer 100 without stress after, for example, ultraviolet (UV) light irradiation (in the case of UV-tape materials) or thermal treatment (in the case of non-UV tape materials).

Figure 3B:
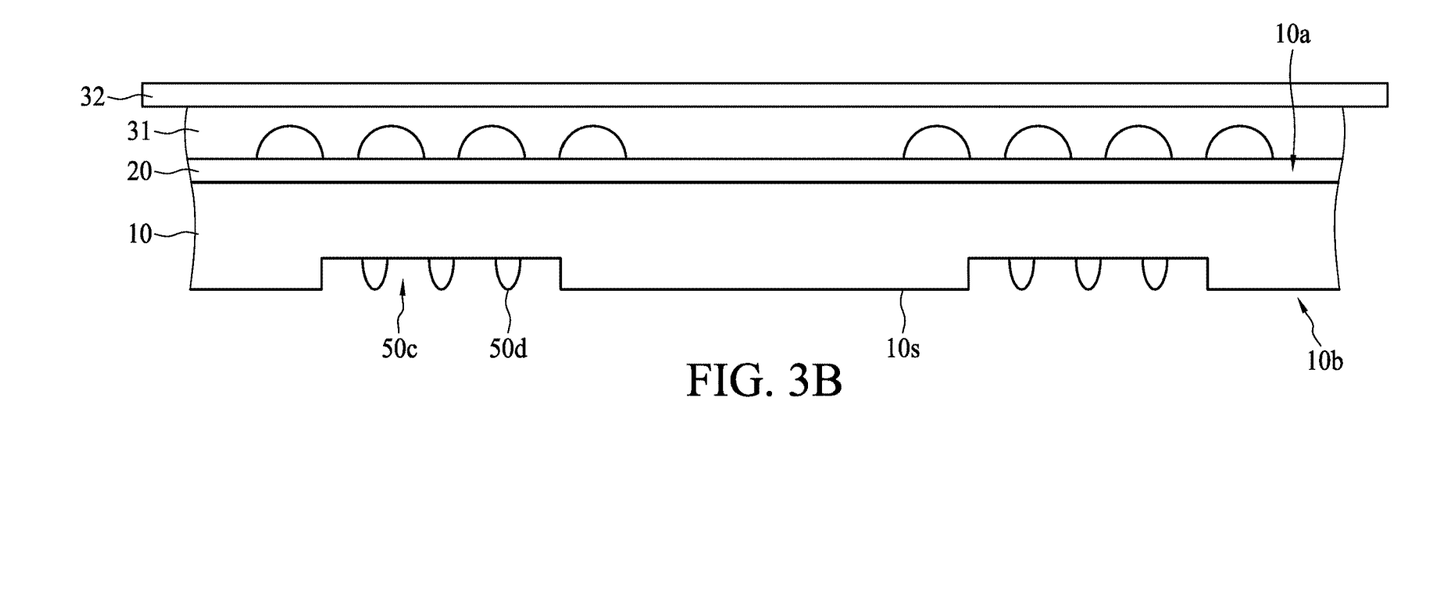

Referring to FIG. 3B, a second tape 32 is mounted on the first tape 31. The second tape 32 functions to hold the semiconductor wafer 100 during a dicing process while mounted to a rigid frame. In an embodiment, the second tape 32 includes a dicing tape. Suitable materials for the second tape 32 may include polymer. The second tape 32 may have relatively poor transmission to a laser, and may thus scatter a laser.

Figure 3C:
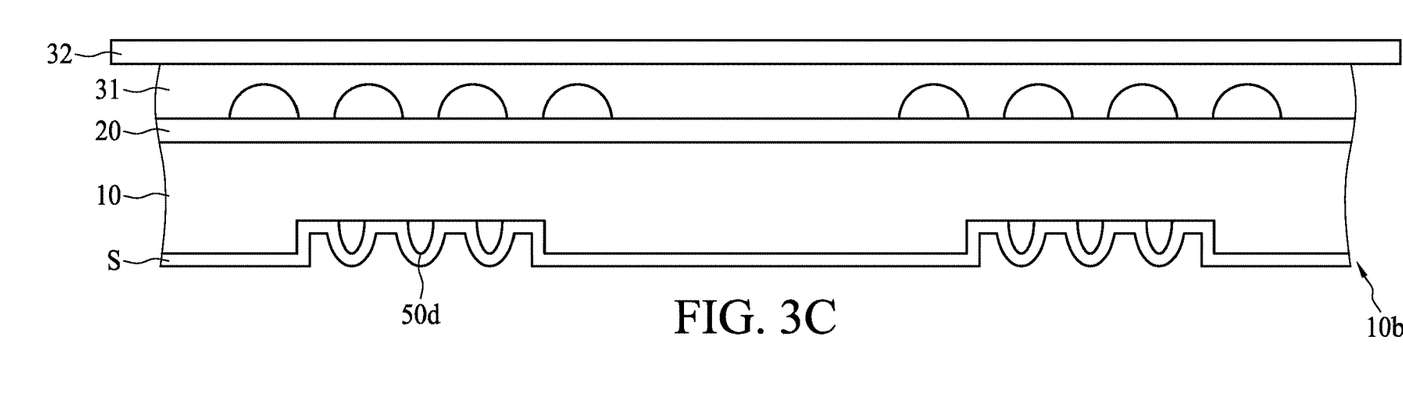
Figure 4:
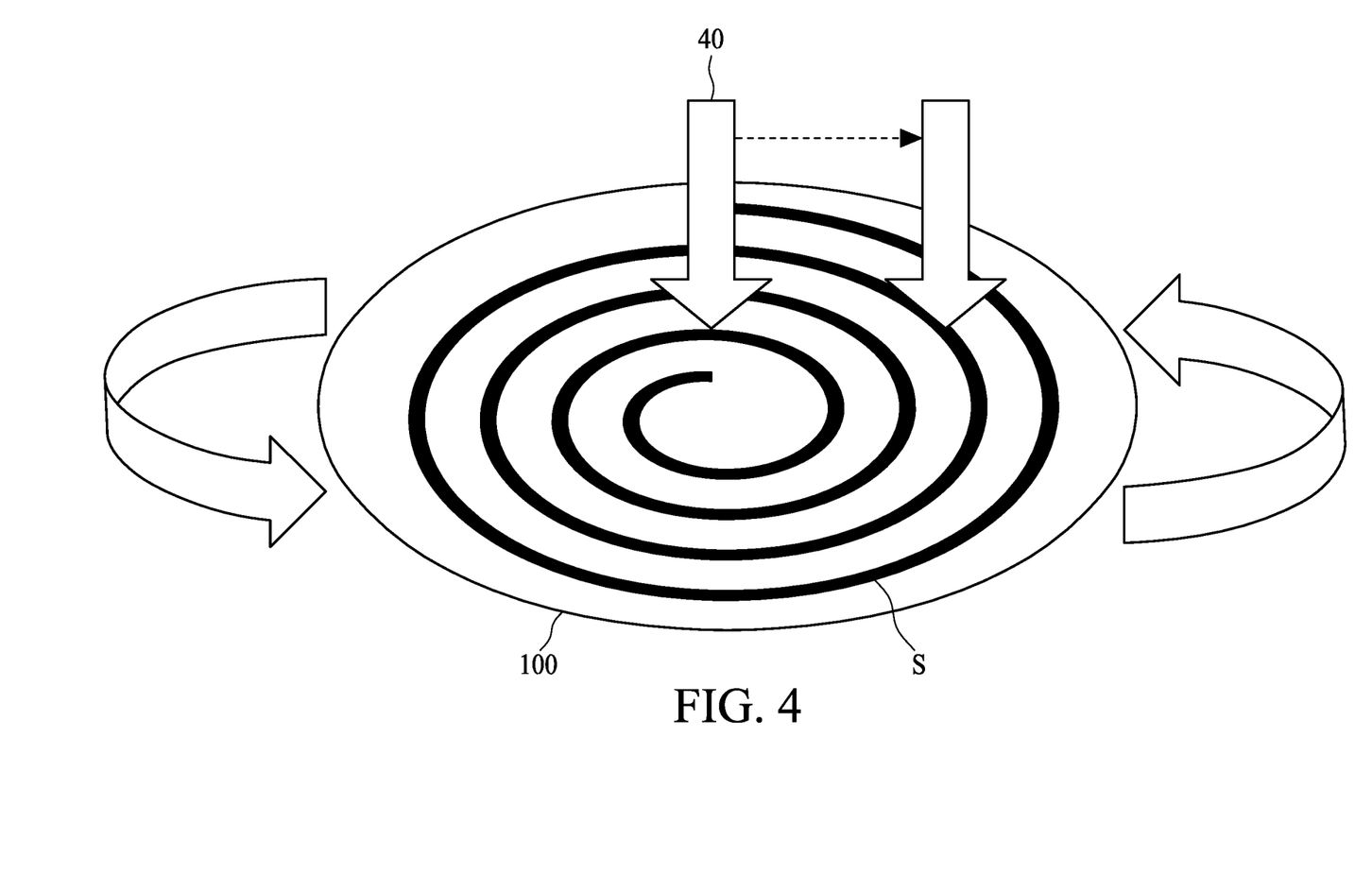
FIG. 4 is a schematic diagram showing an exemplary method of forming a sacrificial layer on a semiconductor wafer as illustrated in FIG. 1.

Referring to FIG. 3C, a sacrificial layer S is formed on the back side 10*b* of the semiconductor wafer 100 in, for example, a coating process. The sacrificial layer S functions to protect an optical device 50*d* from being contaminated by a third tape to be subsequently mounted for expanding the semiconductor wafer 100. Moreover, the sacrificial layer S may be removed after the expansion. In the present embodiment, the sacrificial layer S is conformally formed on the patterned surface 10*s* of the substrate 10, and covers the optical devices 50*d* in the cavities 50*c*. The sacrificial layer S has a thickness ranging from approximately 2 µm to approximately 3 µm. FIG. 4 is a schematic diagram showing an exemplary method of forming a sacrificial layer S on a semiconductor wafer 100 as illustrated in FIG. 1. The exemplary method includes a spin coating process. Referring now to FIG. 4, the semiconductor wafer 100 is spun at a speed of approximately 500 revolutions per minute (rpm) to approximately 1,000 rpm. An amount of material, for example, approximately 20 milliliter (ml), is applied from a dispenser 40 onto the center at the back side 10*b* of the semiconductor wafer 100. The material is suitable for use as a sacrificial layer S. The dispenser 40 moves radially outward from the center to uniformly apply the material, with the help of a centrifugal force due to spinning, on the patterned surface 10*s* of the semiconductor wafer 100.

Figure 3D:
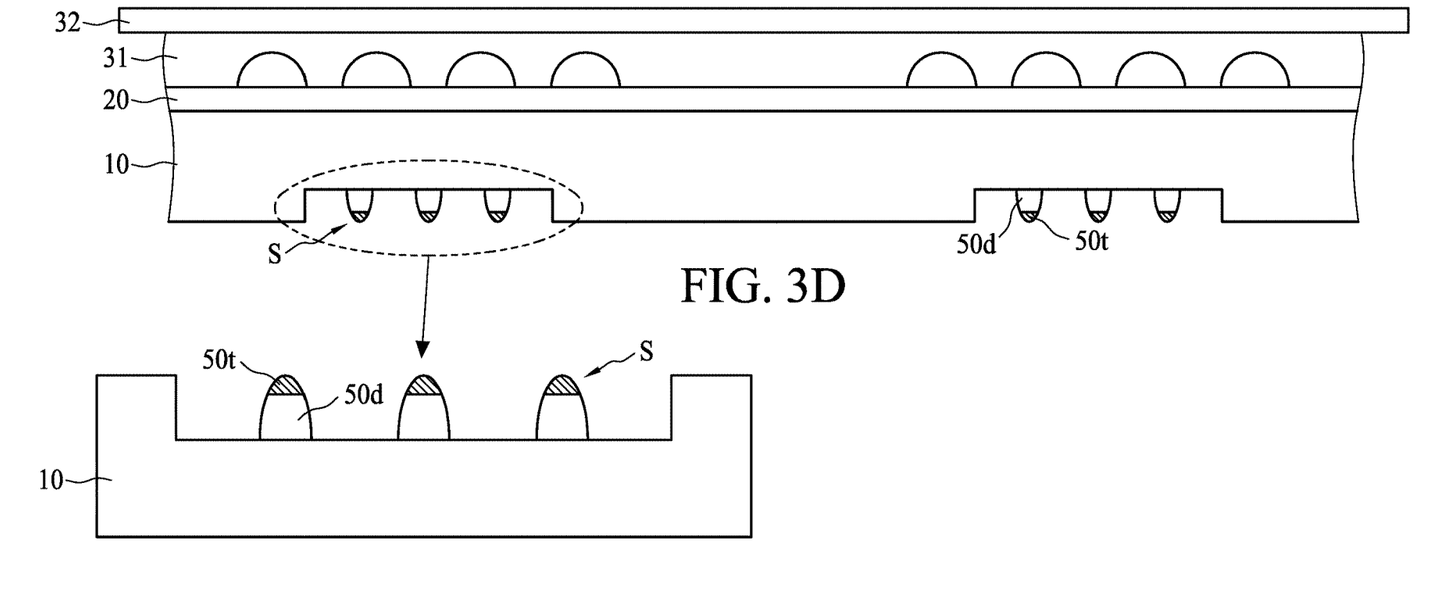

Referring back to FIG. 3C, since the sacrificial layer S is conformally formed on the patterned surface 10*s*, the sacrificial layer S may cover an optical device 50d in entirety. However, as previously discussed with reference to FIG. 2E, since the top portion 50t of an optical device 50d, which physically contacts a tape, suffers tape residue, a sacrificial layer S may be applied to cover, among others, the top portion 50t. Referring to FIG. 3D associated with an enlarged view, in another embodiment, instead of forming a conformal sacrificial layer on the patterned surface 10s as illustrated in FIG. 3C, a sacrificial layer S is formed to cover the top portion 50t of an optical device 50d in a manner sufficiently to isolate the optical device 50d from the tape.

In some embodiments, the semiconductor wafer 100 is provided with, in addition to the optical devices 50d, a sacrificial layer S at the back side 10b. The sacrificial layer S may cover the patterned surface 10s and the optical devices 50d, as in the embodiment illustrated in FIG. 3C, or cover the top portions 50t of the optical devices 50d, as in the embodiment illustrated in FIG. 3D. Either way, the sacrificial layer S isolates the optical devices 50d from a tape to be subsequently mounted for expanding purposes.

Figure 3E:
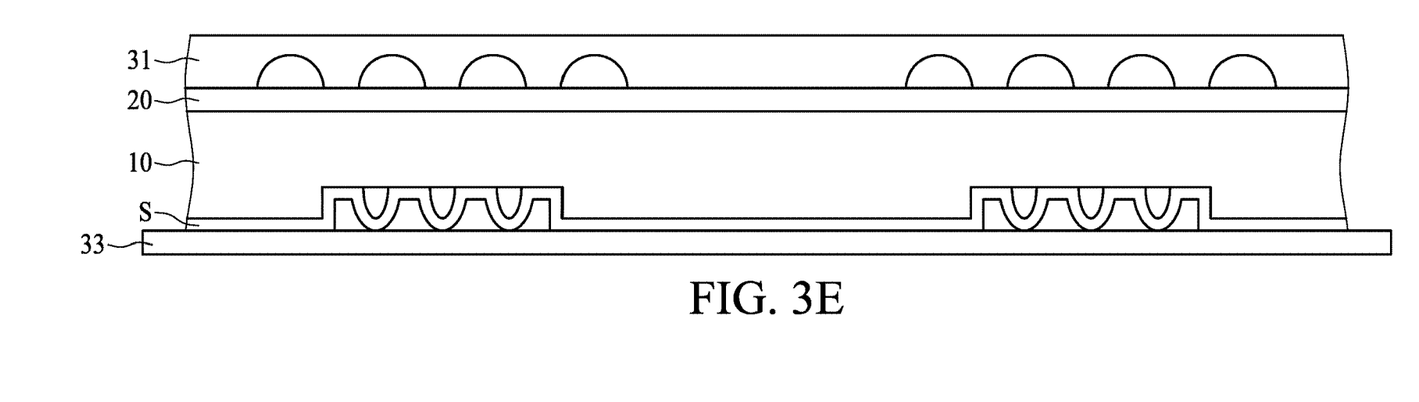

Referring to FIG. 3E, a third tape 33 is mounted on the sacrificial layer S. The third tape 33 contacts the sacrificial layer S instead of an optical device 50d that would otherwise occur in the absence of the sacrificial layer S, as in the case previously described and illustrated with reference to FIG. 2B. With the sacrificial layer S, an optical device 50d, in particular the top portion 50t thereof that is most likely to be stuck with tape residue, is isolated from the third tape 33. As a result, no tape residue 33r can be stuck on the optical device 50d. The third tape 33 may include a through tape, which is similar to or identical with that described and illustrated with reference to FIG. 2B. The third tape 33 is sufficiently transmissive or transparent to allow a laser to pass through. Moreover, the third tape 33 is flexible enough for expansion when pulled on the edges thereof. In an embodiment, also referring to FIG. 2B, the third tape 33 includes a base film 332 made of polyvinylchloride (PVC) or polyolefin (PO), and an adhesive layer 335 made of acrylic material. The adhesive layer 335 may be covered by a release liner (not shown) made of polyethylene terephthalate (PET), which is readily removable from the third tape 33 before use.

Figure 3F:
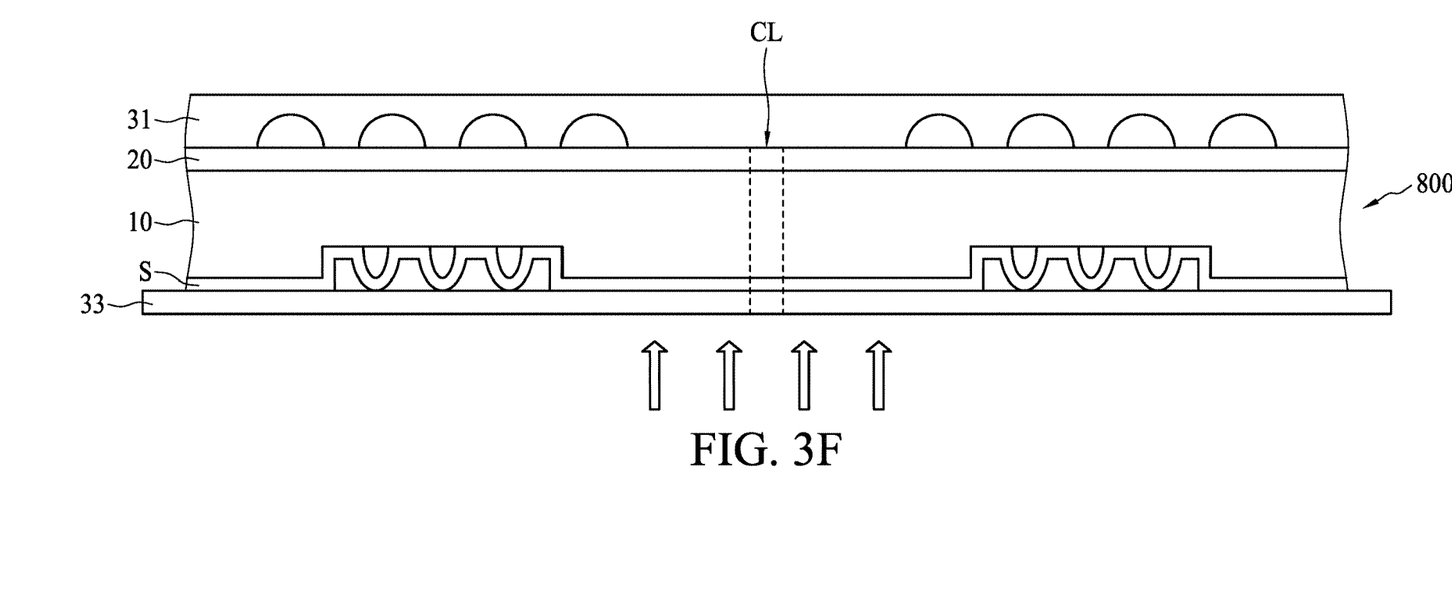

Next, referring to FIG. 3F, a dicing process such as a laser cutting process is conducted on the semiconductor wafer 100 through the third tape 33. In an embodiment, the laser cutting process includes stealth dicing (SD). Initially, a laser (represented by arrows) is applied through the third tape 33. The laser has a focal point within the silicon layer at the back side 10b. The laser does not penetrate the circuitry layer at the front side 10a of the semiconductor wafer 100. The semiconductor wafer 100 is kept intact after the lasing processes with portions of silicon lattice being cleaved in a pattern along the interfaces between adjacent dies 800. The cleaved portion thus acts as a cutting line CL that facilitates separating one die 800 from another. Individual dies 800, though currently not yet separated, can thereby be defined.

Figure 3G:
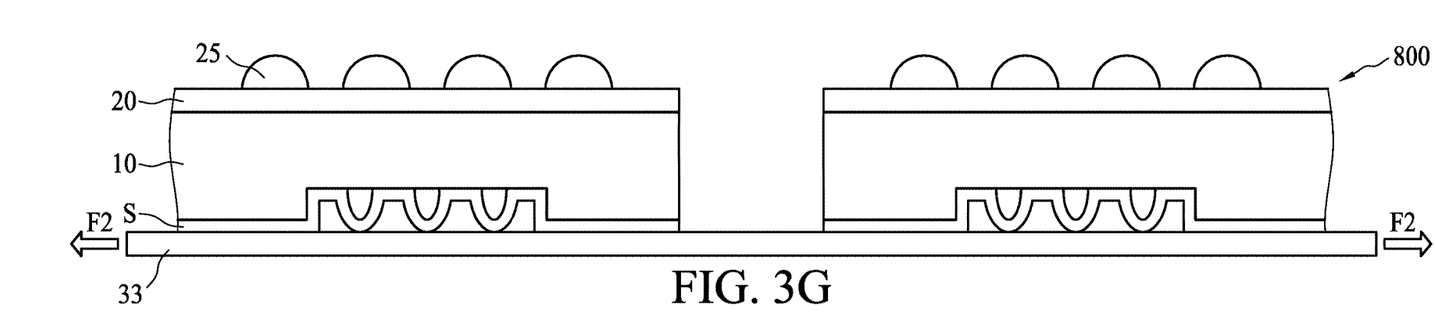

Referring to FIG. 3G, a force F2 is then applied to the third tape 33 by an expanding machine to separate the individual dies 800. The expansion of the third tape 33 causes the silicon lattice to break apart where it has been cleaved by the laser at the cutting line CL. Consequently, the dies 800 defined on the semiconductor wafer 100 are spaced apart from each other as the third tape 33 stretches. The third tape 33 is subsequently removed.

Figure 3H:
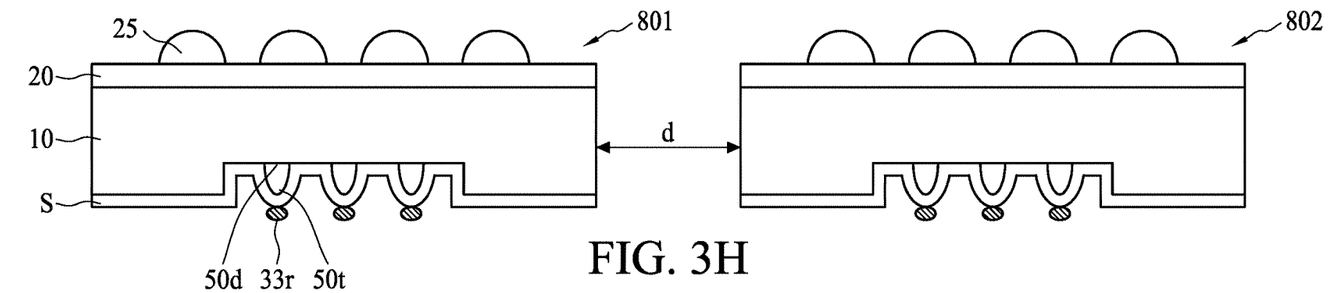
Figure 3I:
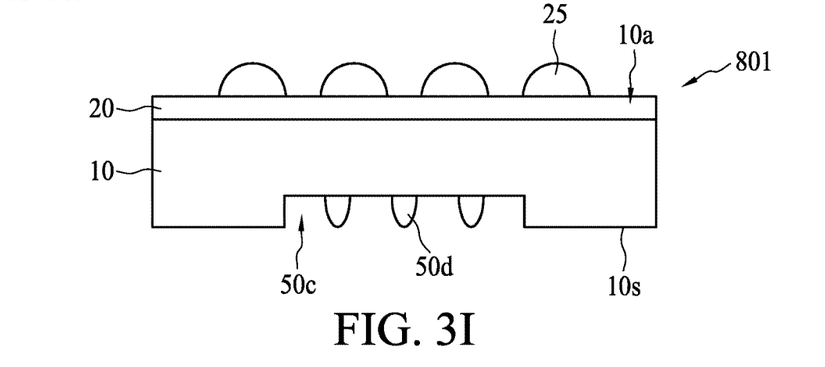

Referring to FIG. 3H, a first die 801 and an immediately adjacent second die 802, for example, of the dies 800 are separated from each other by a gap "d". The gap d, which facilitates a die pick-up operation, may be predetermined by controlling the force F2 from the expanding machine 60. Tape residue 33r may still be stuck or adhered to a surface of an object (e.g., the sacrificial layer S) that contacts the third tape 33 as the third tape 33 is mounted and expands in the direction of the force F2. Obviously, as compared to the case in FIG. 2E, the tape residue 33r no longer stays on an optical device 50d, thanks to the sacrificial layer S which separates the third tape 33 from the optical device 50d. In addition, adhesion strength between the sacrificial layer S and the optical device 50d is larger than that between the sacrificial layer S and the third tape 33. As a result, when the third tape 33 is removed after the expansion, the sacrificial layer S is retained on the optical device 50d. Afterwards, the sacrificial layer S is removed, together with the tape residue 33r stuck thereon, resulting in an individual die or chip 801 as illustrated in FIG. 3I.

In an embodiment, the sacrificial layer S includes a water soluble material, and may be removed by deionized water. Moreover, the water soluble material may include HogoMax. In other embodiments, however, the sacrificial layer S may be removed by thermal treatment, chemical dissolution, light irradiation or manual tear-off.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of processing a semiconductor wafer, the method comprising:
    providing a semiconductor wafer having a front side and a back side, the semiconductor wafer provided with a patterned surface at the back side;
    attaching a first tape onto the front side and mounting a second tape on the first tape before forming a sacrificial layer, the second tape holding the semiconductor wafer during processing;
    forming the sacrificial layer on the back side;
    removing the second tape and exposing the first tape after forming the sacrificial layer and before mounting a tape;
    mounting the tape on the sacrificial layer, the sacrificial layer isolating the patterned surface from the tape, wherein adhesion strength between the sacrificial layer and the patterned surface is larger than that between the sacrificial layer and the tape;
    dicing the semiconductor wafer at the back side through the tape, defining individual chips on the semiconductor wafer;
    removing the first tape after dicing the semiconductor wafer and before expanding the tape;
    expanding the tape to separate the chips from each other; and
    removing the tape after expanding the tape.

2. The method of claim 1, wherein the semiconductor wafer is provided with optical devices in the patterned surface, and the sacrificial layer covers top portions of the optical devices.

3. The method of claim 2, wherein the sacrificial layer is conformally formed on the patterned surface and the optical devices.

4. The method of claim 2, wherein the patterned surface includes cavities for accommodating the optical devices.

5. The method of claim 1, wherein the tape includes a through tape, the first tape includes a backgrind tape, and the second tape includes a dicing tape.

6. The method of claim 1, wherein dicing the semiconductor wafer comprises:
    laser cutting the semiconductor wafer in a stealth dicing process.

7. The method of claim 6, wherein the sacrificial layer includes a water soluble material.

8. The method of claim 7, after expanding the tape, further comprising:
    removing the sacrificial layer by deionized water.

9. A method of processing a semiconductor wafer, the method comprising:
    providing a semiconductor wafer having a front side and a back side, the semiconductor wafer provided with optical devices exposed from the back side;
    attaching a first tape onto the front side before forming a sacrificial layer, the first tape protecting the front side;
    mounting a second tape on the first tape, the second tape holding the semiconductor wafer during processing;
    forming the sacrificial layer on the back side;
    removing the second tape and exposing the first tape after forming the sacrificial layer and before mounting a tape;
    mounting the tape on the sacrificial layer, wherein the sacrificial layer isolating the optical devices from the tape;
    dicing the semiconductor wafer at the back side through the tape, defining individual chips on the semiconductor wafer;
    removing the first tape after dicing the semiconductor wafer and before expanding the tape;
    expanding the tape to separate the chips from each other; and
    removing the tape after expanding the tape.

10. The method of claim 9, wherein the sacrificial layer covers top portions of the optical devices.

11. The method of claim 10, wherein the sacrificial layer is conformally formed on the optical devices.

12. The method of claim 9, wherein adhesion strength between the sacrificial layer and the optical devices is larger than that between the sacrificial layer and the tape.

13. The method of claim 9, wherein dicing the semiconductor wafer comprises:
    laser cutting the semiconductor wafer in a stealth dicing process.

14. The method of claim 9, wherein the sacrificial layer includes a water soluble material, further comprising:
    removing the sacrificial layer by deionized water.

* * * * *